United States Patent [19]

Thierbach

[11] Patent Number: 4,661,922
[45] Date of Patent: Apr. 28, 1987

[54] PROGRAMMED LOGIC ARRAY WITH TWO-LEVEL CONTROL TIMING

[75] Inventor: Mark E. Thierbach, Lincroft, N.J.

[73] Assignee: American Telephone and Telegraph Company, Murray Hill, N.J.

[21] Appl. No.: 448,002

[22] Filed: Dec. 8, 1982

[51] Int. Cl.[4] .............................................. G06F 9/28
[52] U.S. Cl. .................................. 364/716; 364/900; 340/825.83; 307/465
[58] Field of Search ............... 307/465, 466, 467, 468, 307/469, 463; 364/716, 715, 200 MS File, 900 MS File; 340/825.83, 825.85, 825.86, 825.87, 825.79

[56] References Cited

U.S. PATENT DOCUMENTS

| | | | |
|---|---|---|---|
| 3,593,289 | 7/1971 | Lerch et al. | 340/825.83 |
| 3,974,366 | 8/1976 | Hebenstreit | 364/716 |
| 4,032,894 | 6/1977 | Williams | 340/825.83 |
| 4,034,356 | 7/1977 | Howley et al. | 307/465 |
| 4,124,899 | 11/1978 | Birkner et al. | 364/716 |
| 4,399,516 | 8/1983 | Blahut et al. | 364/716 |
| 4,409,499 | 10/1983 | Zapisek et al. | 307/468 |
| 4,415,818 | 11/1983 | Ogawa et al. | 307/465 |
| 4,429,238 | 1/1984 | Harrison | 307/465 |
| 4,488,229 | 12/1984 | Harrison | 364/200 |

OTHER PUBLICATIONS

C. Mead et al., *Introduction to VLSI Systems*, 1980, pp. 75-84.

E. Hebenstreit et al., "High-Speed Programmable Logic Arrays in ESFI SOS Technology," *IEEE Journal of Solid State Circuits*, vol. SC-11, No. 3, Jun. 1976, pp. 370-374 (FIG. 3).

Pending U.S. application D. E. Blahut et al., Ser. No. 233,143, filed Feb. 10, 1981.

Pending U.S. application M. L. Harrison Case, Ser. No. 292,840, filed Aug. 14, 1981.

Pending U.S. application M. L. Harrison et al., Ser. No. 446,343, filed Dec. 2, 1982.

Primary Examiner—Eddie P. Chan
Assistant Examiner—Kevin A. Kriess
Attorney, Agent, or Firm—David I. Caplan

[57] ABSTRACT

A programmed logic array (PLA) is equipped with a first master-slave shift register on the intermediate wordlines (e.g., $W_1, W_2 \ldots W_n$) between AND and OR planes of the PLA and a second master-slave shift register on the output lines emanating from the OR plane. In this way, since the propagation delays of both AND and OR planes are much larger than those of the registers, the speed of operation of the PLA is limited to the greater of the propagation delays of the AND and OR plane instead of the sum of these delays as in prior art.

6 Claims, 4 Drawing Figures

PROGRAMMED LOGIC ARRAY WITH TWO-LEVEL CONTROL TIMING

FIELD OF THE INVENTION

This invention relates to digital data processing systems and more particularly to programmed logic arrays (PLAs).

BACKGROUND OF THE INVENTION

Logic arrays are used in digital data processing systems to perform logic calculations or transformations; that is, to process data by furnishing data signal outputs which are determined by data signal inputs in accordance with prescribed logic transformation rules. For this purpose, programmed logic arrays (PLAs) provide an easily designed and well structured alternative to random (individually distributed) combinatorial (or "combinational") logic devices. The advantages of a PLA stem from its compact integrated circuit layout and its ease of systematic design once the desired logic transformation rule or function (output vs. input) or "characteristic table" is prescribed. Also, because of a PLA's patterned array structure, redefinition of its logical transformation function can be as easily accomplished as modification of a conventional ROM (Read Only Memory) array, i.e., by modification of the pattern of array crosspoints at which cross-connection elements are present vs. absent.

Internally, a conventional PLA comprises two logic array portions known as the AND plane (also known as the DECODER array portion) and the OR plane (also known as the ROM array portion). The AND and OR planes are electrically connected together by paths or lines known as interconnecting (or intermediate) wordlines, say n in number. During operation, a sequence of PLA binary input data signal combinations is entered into the AND plane on a plurality of input lines, say N in number, in order to furnish a sequence of binary input combinations or input words—for example, each word formed by a binary bit string, such as (1,0,1 ... 0,1,0), of binary digital bits, N in number—a sequence of PLA binary output data signals or output words emanates in response thereto from the OR plane on a plurality of output lines, say P in number. When the PLA is adapted for use as a finite state machine, one or more of the binary output signals from the OR plane can be fed back as input bits to the AND plane. Both AND and OR planes, in certain specific embodiments, comprise orthogonal row and column lines mutually intersecting at crosspoints; and at each of the crosspoints is situated or is not situated a crosspoint connecting link such as a transistor, depending upon the desired logic transformation function of the PLA.

The binary signal on a line carrying data in the PLA can be either logic HIGH, representing the binary digital bit ONE ("1"), or else logic LOW, representing the binary digital bit ZERO ("0"). Ordinarily, a given intermediate wordline (between AND and OR planes) will be logic HIGH (binary ONE or 1) if and only if the input word introduced on the input lines of the AND plane is a correspondingly given word. In a specific example, for purpose of illustration, the given intermediate wordline will be logic HIGH if and only if the input word is the bit string characterized by the first bit ($I_1$) being logic HIGH ($I_1 = 1$), and the second bit ($I_2$) being logic LOW ($I_2 = 0$), and the third bit ($I_3$) being logic HIGH ($I_3 = 1$), and ... and the last bit ($I_N$) being logic LOW; that is, if and only if $I_1 = 1$ and $I_2 = 0$ and $I_3 = 1$ and ... and $I_N = 0$ (where N is the number of bits in the input word and hence $I_N$ is the last (N'th) bit). On the other hand, the output signal on a given output line (a given output bit) emanating from the OR plane is logic LOW if and only if any one or more of a given group of intermediate wordlines is logic HIGH, that is, for a specific example, if and only if the first wordline ($W_1$) is logic HIGH, or the third wordline ($W_3$) is logic HIGH, or the sixth wordline ($W_6$) is logic HIGH; that is, the given output bit is ZERO when and only when $W = 1$ or $W_3 = 1$ or $W_6 = 1$. In this way, the PLA supplies output words which are (Boolean) functions of the input words.

In ordinary operation with a PLA, it is desired that the PLA should handle many input words in sequence, one input word after another; that is, that the PLA should perform its prescribed transformation on many words of input data, one input word after another, and should deliver its corresponding output words in sequence, one output word after another. Accordingly, the PLA is supplied with data shifting means (shift registers) for repetitively temporarily storing and shifting (transferring) data into, through, and out of, the PLA—all in accordance with a suitable time sequence, so as to avoid confusion of one word or set of data (say, old data) with another (say, new data) in the PLA. Moreover, the PLA must be able to receive each new input word and to deliver each new output word at appropriate respective moments of time or during appropriate time intervals, according to the system requirements of the rest of the data processing system in which the PLA operates. Such system requirements typically are "synchronous": that is, PLA receives data from and delivers data to the rest of the system in response to (periodic) clock control timing, typically in the form of a sequence of clock pulses. In such a case, the PLA can receive input data only during a first predetermined portion or phase of each cycle (period) of the clock control, and the PLA can deliver output data only during a second predetermined (in general, different) portion or phase of each such cycle of the clock. For example, if the clock has two phases ($\phi_1$, $\phi_2$) per cycle, then the PLA typically receives data during one of the phases ($\phi_1$) and delivers data during the other of the phases ($\phi_2$) of each cycle. If the clock has a cycle time or period equal to T, then the PLA can thus receive and deliver $1/T$ words per unit time. Accordingly, the rate at which the PLA processes (receives and delivers) data is inversely proportional to the period T of the control clock and is directly proportional to the clock frequency $f = 1/T$.

The data shifting means required in a PLA ordinarily takes the form of a pair of clocked parallel shift registers for temporarily storing periodically shifting data. Each register typically takes the form of a group of flip-flop devices (each device being a pair of cross-coupled inverters, the output of one being the input of the other) mutually arranged in parallel, that is, so that each entire binary word being processed by the PLA can be transferred (entered) into, temporarily stored in, and transferred out of the register—all in response to a single clock cycle of the control timing supplied to the registers. The pair of registers is ordinarily connected and supplied with control timing so as to operate in a "master-slave" relationship, that is, one of the registers serving as the "master" register and the other as its "slave."

By definition, the master receives data from an external source (such as another register) and its slave receives data from its master, all in response to control timing arranged so that when one of the registers (master or slave) can receive new data, the other cannot.

Thus, for example, during a first phase of a cycle of the clock used to control the timing of both master and slave, data can enter into the master register but not into its slave, and during a second phase of the control cycle, data is shifted (transferred) from the master into its slave register but then no data can enter into the master.

In prior art, a single pair of registers is thus used in master-slave relationship to control the flow of data through a PLA, and thus the PLA operates with single-level control timing whereby data is transferred through and is processed by the PLA within a single clock cycle. Thus in prior art input data enters into, is transformed by, and emanates from the PLA as (logically transformed) output data all during a single cycle (or "clock period") of the control timing of the registers.

Single-level control timing is exemplified in the prior art by placing a master register in the wordlines, between the AND and OR planes of a PLA, and a slave register in the output lines of the OR plane of the PLA as described in greater detail in a paper by E. Hebenstreit et al entitled "High-Speed Programmable Logic Arrays in ESFI SOS Technology," published in *IEEE Journal of Solid State Circuits*, Vol. SC-11, pp. 370–374 (1976). Alternatively, a master register can be placed on the input lines of the AND plane and a slave register on the output lines of the OR plane.

There is an upper limit on the above-mentioned clock frequency $f = 1/T$ usable by the PLA, and hence upon the rate at which the PLA can process data. This upper limit stems from the inherent propagation delay times of the circuit components of the PLA (AND plane, OR plane, and registers), that is, the minimum time required for data to be transferred from one (input) end of a component to the other (output) end thereof regardless of how fast the clock frequency may be. A typical cause of such delay in a circuit component is the RC time constant of interconnecting metallization (wiring) of the AND plane.

Because of the relatively large physical sizes of the AND and OR planes along the directions of data propagation, the propagation delay through either of these planes is ordinarily much larger (by a factor of about ten or more) than the propagation delay through a register. For proper operation, however, to avoid undesirable confusion of old and new data, the clock cycle time or period used in single-level PLA control timing should be greater than the sum of the propagation delays of the AND and OR planes plus the sum of the propagation delays of the registers. Accordingly, the speed of the clock that can be used to control the timing of the registers in prior art single-level control timing is limited (ordinarily) to approximately the sum of the propagation delays of the AND and OR planes (that is, neglecting the relatively small delays of the registers themselves). Hence, the maximum speed of operation of the PLA is likewise limited by approximately the sum of these propagation delays; that is, the minimum time interval between successive words that can be processed and delivered by the PLA is limited to approximately this sum of propagation delays. Moreover, the maximum speed at which the PLA can operate is often the limiting factor on the overall speed of operation of the entire data processing system in which the PLA operates. It would therefore be desirable to have a means for increasing the maximum possible speed at which a given PLA can operate. On the other hand, in other systems it is sometimes desirable to use a more powerful PLA, i.e., of larger logic transformation capacity—that is, capable of handling longer (more bits) input and output words and more wordlines—but such larger PLA size would entail an undesirable decrease in maximum possible operating speed. If the above-mentioned desirable means for increasing the maximum possible PLA operating speed would be available, larger and hence more powerful PLAs could be used without undesirably lowering the operating speed of the data processing system.

SUMMARY OF THE INVENTION

A PLA (e.g., 400, FIG. 4) in accordance with the invention, which can operate at faster speeds for a given size (or which can have a larger size for a given speed of operation), comprises an AND plane (e.g., 11), an OR plane (e.g., 14), and a plurality of intermediate wordlines (e.g., $W_1, W_2, \ldots W_n$) connected therebetween, with a first master and a first slave parallel register both connected on the intermediate wordlines in master-slave relationship for receiving intermediate data from the AND plane and delivering the intermediate data to the OR plane, and a second master parallel register (e.g., 16) connected to receive output data emanating from the OR plane, the propagation delay of at least one of the AND and OR planes being much larger than that of any of the registers. A second slave parallel register is advantageously connected to receive output data from the rest of a data processing system and from the second master register, and to deliver input data to the AND plane. The PLA, as thus furnished with registers and control timing, implements a finite state machine. Each parallel register advantageously implements one serial stage (one master stage or one slave stage). Both the first and second master registers can be controlled (timed) by a first phase ($\phi_1$) of clock control timing, while both slave registers can be controlled by a second phase ($\phi_2$) of control timing nonoverlapping with the first phase ($\phi_1$).

Data being processed by the PLA, as thus supplied with registers, takes two cycles of the clock to be transferred through the PLA, as opposed to one cycle in prior art; and while one set of data is being transferred through (and logically transformed by) the AND plane, another set of data is transferred (by the registers) through the OR plane. In this way, the speed of operation as determined by the speed of the control timing (clock cycle period) can now be made approximately equal to the larger of the propagation delay times of the AND and OR planes, rather than to the sum of these two delay times as in prior art. Accordingly, for example, in case the propagation delays of AND and OR planes are approximately equal, the PLA in this invention can operate at approximately twice the clock rate that is possible in prior art, and thus the PLA in this invention can then process data likewise at approximately twice the data processing rate possible in prior art. The PLA in accordance with the invention thus still yields a (full) new output word during every new clock cycle, even though the PLA now requires two clock cycles to process each word. Thus, by using the higher clock frequency made possible by this invention, the PLA supplies output words at a correspondingly higher rate, even though it now takes two clock cycles for the PLA to process each word.

BRIEF DESCRIPTION OF THE DRAWING

This invention together with its features, objects, and advantages can be better understood from the following detailed description when read in conjunction with the drawing in which:

As shown in FIG. 1, a PLA 100 implementing a finite state machine includes (in succession) input lines $I_1, I_2 \ldots I_N$, an AND plane 11, intermediate wordlines $W_1, W_2 \ldots W_n$, a first master parallel register 12, a first slave parallel register 13, an OR plane 14, OR plane output lines $O_1, O_2 \ldots O_p$, an inverter array 15, a second master parallel register 16, a second slave parallel register 17, and PLA output lines $Z_1, Z_2 \ldots Z_p$. The signal output on line $Z_p$, for example, is fed back on a feedback line 25 to become a signal input on line $I_N$, in order to implement a finite state machine.

Figure 3:
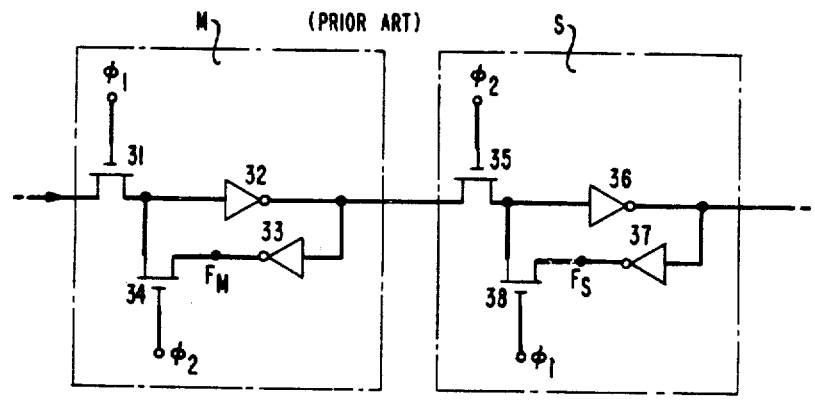
FIG. 3 is a schematic circuit diagram of a pair of registers, in master-slave relationship, useful in the embodiment shown in FIG. 1.

The first master register 12 includes a linear array of master stages, each stage typically a clocked flip-flop device, each labelled M; and the first slave register 13 also includes a linear array of slave stages, each stage typically also a clocked flip-flop device, each labelled S. A specific example of a clocked master stage and a clocked slave stage is shown in FIG. 3. Similarly each of the second master and slave registers 16 and 17 (with master stages M and slave stages S), is typically in the form of a linear array of clocked flip-flops. Each master register can receive data when and only when a first control timing sequence $\phi_1$ is HIGH; each slave, when a second control timing sequence $\phi_2$ is HIGH. The inverter array 15 serves to invert (from ONE to ZERO, from ZERO to ONE) the signals on the OR plane output lines $O_1, O_2 \ldots O_p$ emanating from the OR plane 14, to form PLA output signals on PLA output lines $Z_1, Z_2 \ldots Z_p$. It should be understood that the inverter array 15 is optional and can be omitted in case inversion of signal on the output lines is not desired.

Figure 2:
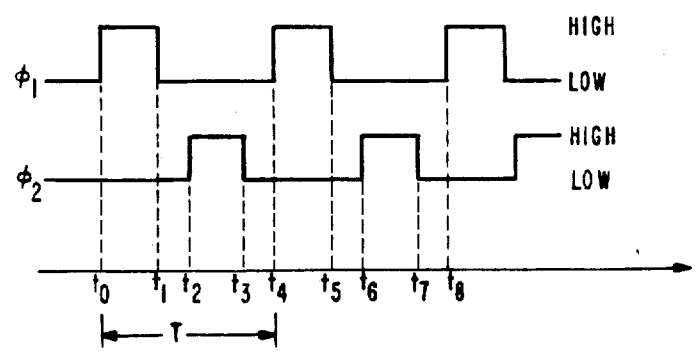
FIG. 2 is a diagram of control timing sequences useful in the embodiment shown in FIG. 1.

The phases of the control timing $\phi_1$ and $\phi_2$ for the registers 12, 13, 15, and 16 are arranged in general so that when data can enter into a master register none can enter into its slave, and when data can enter into a slave register (from its master) none can enter into its master. Accordingly, waveforms of the control timing sequences for the master and slave registers, respectively, can be selected as represented in FIG. 2, that is, first and second (periodic) clock pulse sequences $\phi_1$ and $\phi_2$, respectively, of mutually nonoverlapping HIGH phases. These sequences are thus arranged as desired: whenever $\phi_1$ is HIGH and the master registers can receive data, then $\phi_2$ is LOW and hence none of the slave registers can receive any data, and whenever $\phi_2$ is HIGH and hence the slave registers can receive data, then $\phi_1$ is LOW and hence none of the master registers can receive any data.

During operation, an input data word enters the AND plane 11 of the PLA 100 on input lines $I_1, I_2 \ldots I_N$ either from an external source (not shown) or as feedback (in the case of $I_N$, for example), and the input data are transformed by the AND plane into intermediate data which are received by the first master register 12 on wordlines $W_1, W_2 \ldots W_n$ emanating from the AND plane during a HIGH phase (e.g., $t_0t_1$) of the first sequence $\phi_1$. Next, during the succeeding HIGH phase ($t_2t_3$) of the second sequence $\phi_2$, these intermediate data are received by the first slave register 13. Then, during the succeeding HIGH phase ($t_4t_5$) of the first sequence $\phi_1$, the intermediate data from the slave register 13 are transformed by the OR plane 14 and the inverter array 15 and are received as output data by the second master register 16. Next, during the succeeding HIGH phase ($t_6t_7$) of the second sequence $\phi_2$, the output data are received by the second slave register 17 from the second master register 16. The data, as thus processed by the PLA into output data, are then available for transfer into other registers located in other portions of the data processing system (not shown) in which the PLA 100 operates.

FIG. 3 shows and example (from prior art) of a pair of register stages (master stage M, and slave stage S) in master-slave relationship, useful for the registers in the PLA 100. A transistor 31, controlled by the first sequence $\phi_1$, serves as an input gate for the master M; and a transistor 35, controlled by the second sequence $\phi_2$, serves as an input (or coupling) gate for the slave S. A pair of inverters 32 and 33, together with a transistor 34 in a feedback loop and controlled by the second sequence $\phi_2$, serves as a regenerative temporary storage means (latch) for the master M; and a pair of inverters 36 and 37, together with a transistor 38 located in a feedback loop and controlled by the first sequence $\phi_1$, serves as a regenerative temporary storage means (latch) for the slave S. During HIGH phases of the first sequence $\phi_1$ the transistors 31 and 38 controlled by this first sequence are ON, and are OFF otherwise. During HIGH phases of the second sequence $\phi_2$ the transistors 34 and 35 controlled thereby are ON, and are OFF otherwise.

During operation, for example starting at time interval $t_0t_1$ when the first sequence $\phi_1$ is HIGH (transistors 31 and 38 ON, transistors 34 and 35 OFF), data is received by the master M and is amplified by inverters 32 and 33 and reaches a feedback node $F_M$ located between inverter 33 and transistor 34. Because input transistor 35 in the slave S is OFF during $t_0t_1$, no data can then be received by the slave S. Next, during $t_2t_3$ when the second sequence $\phi_2$ is HIGH and hence transistors 34 and 35 controlled thereby are ON (transistors 31 and 38 are OFF), the data then enters into the slave S and is amplified by inverters 36 and 37 and reaches a feedback node $F_S$ located between inverter 37 and transistor 38. At the same time (during $t_2t_3$), since transistor 34 in the feedback loop of the master M is ON, the inverters 32 and 33 are cross-coupled (latched) together, thereby furnishing a temporary regenerative static latch. Next, during $t_4t_5$ when the first sequence is again HIGH, input transistor 31 enables entry of new data into the master M, while the now cross-coupled inverters 36 and 37 latch the old data in the slave S now that its feedback loop transistor 38 is ON, but the slave S cannot now (yet) receive the new data because its input (coupling) transistor 35 is OFF. Thereafter, during $t_6t_7$, $\phi_2$ is HIGH, the slave S receives the new data from its master M which then is latching the new data. In this way, data is repetitively shifted into and through the master and slave registers, new data replacing old data.

The feedback loops formed by inverters 33 and 37, together with the transistors 34 and 38, respectively, serve as (regenerative) static latches for the master and slave, respectively. Static latches have the advantage of being able to store data in case the control timing terminates, i.e., the clock stops, so long as D.C. power continues to be supplied to the inverter. In cases where a static latch function is not required in either master or slave (or both), either (or both) of these feedback loops can be omitted; that is, instead of static register stages M or S (or both), dynamic register stages can be used, as known in the art. Moreover, the inverter array 15 can be omitted by placing one of the inverters in the feedback loops of master or slave register 16 or 17 into the direct data path, that is, for example, by placing the inverter 33 between the transistor 31 and the inverter 32, as suggested in the aforementioned paper by E. Hebenstreit et al.

Figure 1:
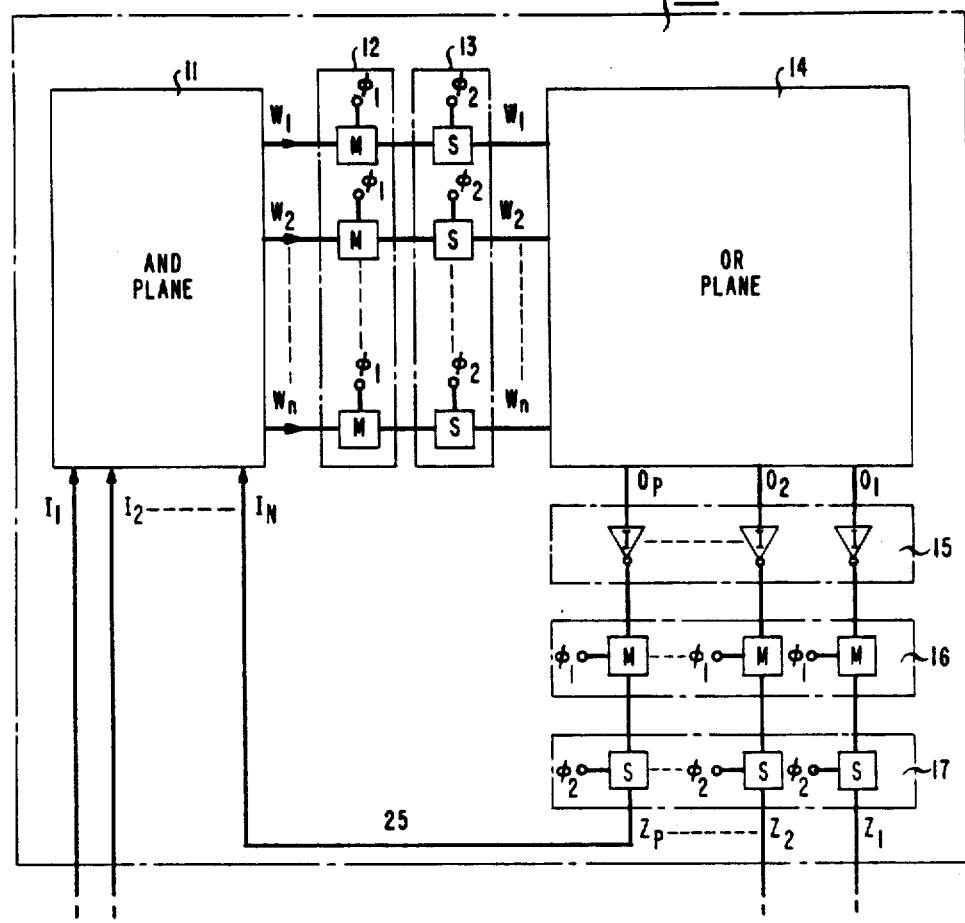
FIG. 1 is a block diagram of a PLA equipped with shift registers for two-level control timing in accordance with a specific embodiment of the invention.
Figure 4:
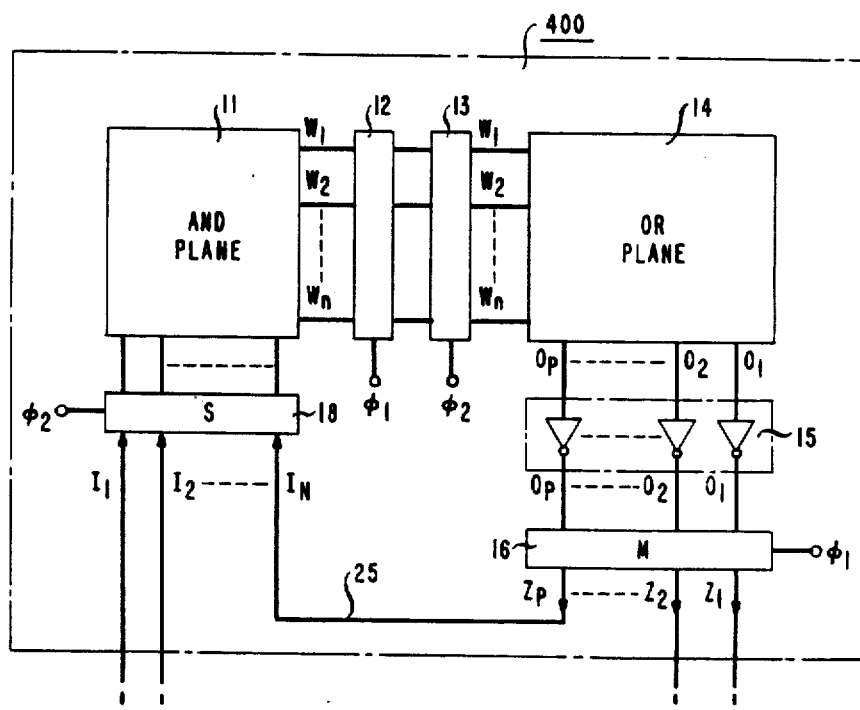
FIG. 4 is a block diagram of a PLA equipped with shift registers for two-level control timing, in accordance with another specific embodiment of the invention.

FIG. 4 shows a PLA 400 equipped with two-level control timing in accordance with another specific embodiment of the invention. The PLA 400 is similarly constructed as the PLA 100 except for the placing of a second slave register 18 on the input lines $I_1, I_2 \ldots I_N$ rather than on the output lines. The second slave register thus serves as an input register 18 for the AND plane 11. The same reference indicators are used in FIG. 4 as in FIG. 1 to denote similar elements. It should be understood that this input register 18 typically is formed by a parallel register having N parallel stages.

An advantage of the arrangement shown in FIG. 4 is that the control timing of the input register 18 can easily be gated with combinatorial logic; that is, instead of using the second clock pulse sequence $\phi_2$ as the control timing for the input register 18, this sequence $\phi_2$ is AND-gated by an auxiliary or WAIT signal, and the resulting gated (interrupted) $\phi_2$ sequence is used as the control timing for the input register 18—all as described in greater detail in patent application Ser. No. 233,143 filed on Feb. 10, 1981, entitled "Programmable Logic Array" (D. E. Blahut et al.) and in patent application Ser. No. 446,343 filed on Dec. 2, 1982, entitled "PLA-Based Finite State Machine With Combinatorial Logic Control of Input Register Thereof" (M. L. Harrison et al.). Briefly, the control timing sequence $\phi_2$ for the input register 18 is stopped (interrupted) when the WAIT signal is LOW ("unready") and thus the finite state machine is frozen with the same data on all feedback lines until the WAIT signal goes HIGH ("ready") and thus the machine resumes normal operation with the periodic (not-stopped) control timing sequences $\phi_1$ and $\phi_2$.

Although the invention has been described in detail in terms of specific embodiments, various modifications can be made without departing from the scope of the invention. For example, instead of the first and second nonoverlapping clock pulse sequences $\phi_1$ and $\phi_2$, a clock pulse sequence $\phi$ of HIGH and LOW phases of equal durations together with its complement $\bar{\phi}$, respectively, can be used as control timing for the registers in those cases where the safety margin against undesirable "race-through" (premature shifting) afforded by the time intervals $t_1t_2$, $t_3t_4$, $t_5t_6$, $t_7t_8$ (when both sequences are LOW) is not required, as known in the art. Also, it should be understood that, for example, especially in FIG. 4, the master registers equivalently can be denoted as slave registers while the slave registers are denoted as master registers.

What is claimed is:

1. A programmed logic array comprising:
   (a) an AND plane
   (b) an OR plane
   (c) intermediate wordlines connecting the OR plane to the AND plane;
   (d) a first master register connected in the intermediate wordline, for receiving intermediate data from the AND plane in response to a first control timing sequence;
   (e) a first slave register connected for receiving the intermediate data from the first master register and for delivering the intermediate data to the OR plane in response to a second control timing sequence; and
   (f) a second master register connected for receiving output data from the OR plane in response to a third control timing sequence, the propagation delays of the OR plane and of the AND plane being much larger than those of any of the registers.

2. The programmed logic array of claim 1 further comprising a second slave register connected for receiving the output data from the second master register in response to a fourth control timing sequence.

3. The programmed logic array of claim 2 in which the third and fourth control timing sequences are substantially the same, respectively, as the first and second control timing sequences, whereby the PLA operates with two-level control timing.

4. The programmed logic array of claim 1 further comprising a second slave register connected for receiving input data and for delivering the input data to the AND plane in response to a fourth control timing sequence.

5. The programmed logic array of claim 4 in which the third control timing sequence is substantially the same as the first.

6. The programmed logic array of claim 5 in which the second master register has at least one output line which is connected as an input line to the second slave register, whereby the programmed logic array implements a finite state machine.

* * * * *